United States Patent
Wei et al.

(10) Patent No.: US 10,790,321 B2
(45) Date of Patent: Sep. 29, 2020

(54) CMOS IMAGE SENSOR HAVING INDENTED PHOTODIODE STRUCTURE

(71) Applicant: Taiwan Semiconductor Manufacturing Co., Ltd., Hsin-Chu (TW)

(72) Inventors: Chia-Yu Wei, Tainan (TW); Hsin-Chi Chen, Tainan (TW); Kuo-Cheng Lee, Tainan (TW); Ping-Hao Lin, Tainan (TW); Hsun-Ying Huang, Tainan (TW); Yen-Liang Lin, Tainan (TW); Yu Ting Kao, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/017,078

(22) Filed: Jun. 25, 2018

(65) Prior Publication Data

US 2019/0103428 A1    Apr. 4, 2019

Related U.S. Application Data

(60) Provisional application No. 62/565,315, filed on Sep. 29, 2017.

(51) Int. Cl.
  *H01L 27/146*    (2006.01)

(52) U.S. Cl.
  CPC .... *H01L 27/14607* (2013.01); *H01L 27/1461* (2013.01); *H01L 27/1463* (2013.01); *H01L 27/14612* (2013.01); *H01L 27/14621* (2013.01); *H01L 27/14636* (2013.01); *H01L 27/14641* (2013.01); *H01L 27/14689* (2013.01);

(Continued)

(58) Field of Classification Search
  CPC .......... H01L 27/14607; H01L 27/1461; H01L 27/14612; H01L 27/14621; H01L 27/1463; H01L 27/14636; H01L 27/14641; H01L 27/14689; H01L 27/14645; H01L 27/1464; H01L 27/14647
  See application file for complete search history.

(56) References Cited

U.S. PATENT DOCUMENTS

2006/0244020 A1* 11/2006 Lee ................... H01L 27/14603
                                                                257/291
2008/0110173 A1   5/2008 Bunker
(Continued)

*Primary Examiner* — Patricia D Reddington
(74) *Attorney, Agent, or Firm* — Eschweiler & Potashnik, LLC

(57) ABSTRACT

The present disclosure relates to a CMOS image sensor, and an associated method of formation. In some embodiments, the CMOS image sensor comprises a floating diffusion region disposed at one side of a transfer gate within a substrate and a photo detecting column disposed at the other side of the transfer gate opposing to the floating diffusion region within the substrate. The photo detecting column comprises a doped sensing layer with a doping type opposite to that of the substrate. The photo detecting column and the substrate are in contact with each other at a junction interface comprising one or more recessed portions. By forming the junction interface with recessed portions, the junction interface is enlarged compared to a previous p-n junction interface without recessed portions, and thus a full well capacity of the photodiode structure is improved.

20 Claims, 9 Drawing Sheets

(52) U.S. Cl.
CPC .... *H01L 27/1464* (2013.01); *H01L 27/14645* (2013.01); *H01L 27/14647* (2013.01)

(56) References Cited

U.S. PATENT DOCUMENTS

| | | | |
|---|---|---|---|
| 2009/0140304 A1* | 6/2009 | Kudoh | H01L 27/14603 257/292 |
| 2010/0148291 A1* | 6/2010 | Tivarus | G02B 5/208 257/432 |
| 2010/0327389 A1* | 12/2010 | McCarten | H01L 27/14603 257/447 |
| 2011/0176041 A1 | 7/2011 | Kudoh | |
| 2015/0221689 A1 | 8/2015 | Lee et al. | |
| 2016/0141321 A1 | 5/2016 | Hsieh et al. | |

\* cited by examiner

CMOS IMAGE SENSOR HAVING INDENTED PHOTODIODE STRUCTURE

REFERENCE TO RELATED APPLICATION

This application claims priority to U.S. Provisional Application No. 62/565,315, filed on Sep. 29, 2017, the contents of which are hereby incorporated by reference in their entirety.

BACKGROUND

Digital cameras and optical imaging devices employ image sensors. Image sensors convert optical images to digital data that may be represented as digital images. An image sensor includes a pixel array (or grid) for detecting light and recording intensity (brightness) of the detected light. The pixel array responds to the light by accumulating a charge. The accumulated charge is then used (for example, by other circuitry) to provide a color and brightness signal for use in a suitable application, such as a digital camera.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
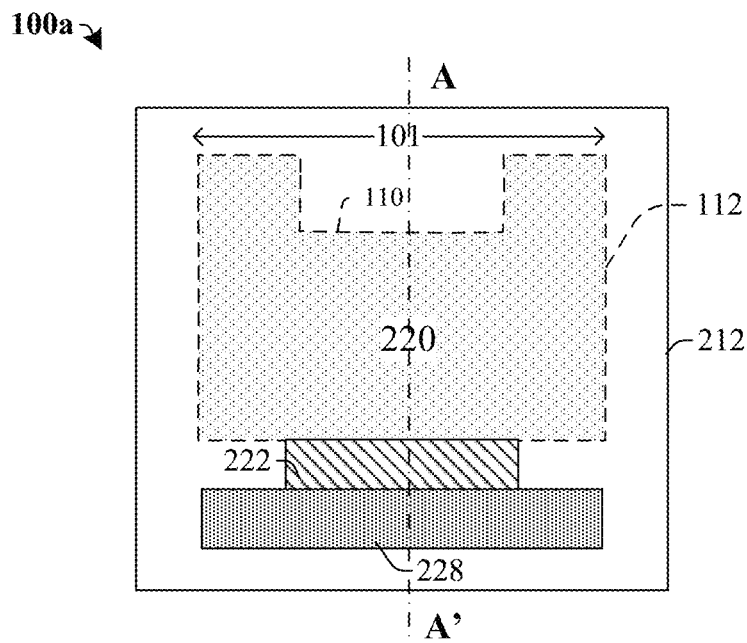
FIG. 1A and FIG. 1B illustrate top views of a CMOS (complementary metal-oxide-semiconductor) image sensor including a photodiode structure having an indented junction interface in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuit (IC) technologies are constantly being improved. Such improvements frequently involve scaling down device geometries to achieve lower fabrication costs, higher device integration density, higher speeds, and better performance. CMOS image sensors have become the main image sensor technology for both commercial and scientific applications. Due to device scaling, pixels of the pixel array of a CMOS image sensor have smaller dimensions and are closer to one another. To achieve high dynamic range by the small CMOS image sensor, a high full well capacity (FWC) is desired. However, a full well capacity of the photodiode of the CMOS image sensor is limited by its implant profile. One way to increase the full well capacity is to increase the ion-implant dosage when fabricating P-N junction of the photodiode of CMOS image sensor. However, the photodiode profile is hard to control with the high dosage ion-implantation. Also, the thermal budget affects the performance of the CMOS image sensor and degrades the picture quality.

The present disclosure relates to a CMOS image sensor comprising a photodiode structure having an indented p-n junction interface, and an associated method of formation. In some embodiments, the CMOS image sensor comprises one or more recessed portions that are substantially symmetrically distributed along an extended line of centers of a gate electrode and a floating diffusion region. The area of the p-n junction interface is increased (for a certain pixel size) by having the recessed portions, and such that the number of the electron-hole pairs is increased to increase a full well capacity of the CMOS image sensor. In some embodiments, with reference to FIG. 2 for example, a sensing pixel 124 of a CMOS image sensor has a substrate 212 and a transfer gate 222d disposed over the substrate 212. A floating diffusion region 228 is disposed at one side of the transfer gate 222d within the substrate 212. A photo detecting column 220d is disposed at the other side of the transfer gate 222d within the substrate 212 opposing to the floating diffusion region 228. In some embodiments, photo detecting column 220d includes at least one pinned photodiode. The photo detecting column 220d and the substrate 212 are in contact with each other at a junction interface 112 and are configured as a photodiode structure to convert radiation that enters the substrate 212 into an electrical signal. In some instances, the junction interface 112 comprises one or more recessed portions. Thereby, the junction interface 112 is enlarged compared to a previous p-n junction interface without recessed portions, and thus a full well capacity of the photodiode structure is improved.

Figure 1B:
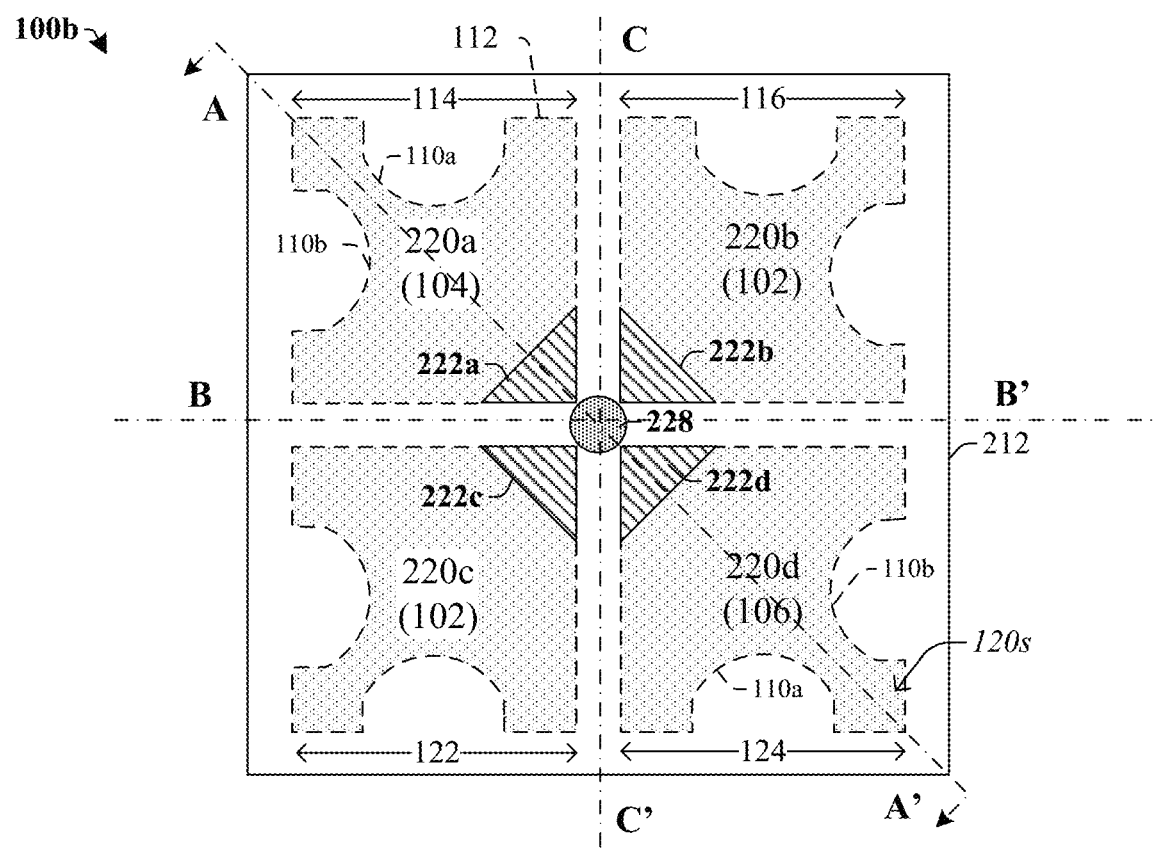

A description of a back-side illuminated (BSI) CMOS (complementary metal-oxidesemiconductor) image sensor device in accordance with various indented p-n junction interface embodiments of the present disclosure is discussed in association with FIGS. 1A-1B. FIG. 1A illustrates a top view of a CMOS image sensor 100a including a photodiode structure having an indented junction interface according to some embodiments. In some embodiments, an image sensing pixel 101 comprises a photo detecting column 220 disposed within a substrate 212. A floating diffusion region 228 is disposed within the substrate 212 aside of the photo detecting column 220. A transfer gate 222 is disposed overlying the substrate 212 between the floating diffusion region 228 and the photo detecting column 220. The photo detecting column 220 and the substrate 212 are in contact with each other at a junction interface 112. The junction interface 112 may comprise one or more recessed portions 110. The recessed portions 110 may be symmetrically distributed along an extended line A-A' of centers of the transfer gate 222 and the floating diffusion region 228. The recessed portions 110 can be any applicable shapes. For example, the recessed portions 110 can be a rectangular as shown in FIG. 1A. The recessed portions 110 can also be a "finger" shape having a continuous curve surface or a semi-circle. FIG. 1B illustrates a top view of a CMOS image sensor 100b including a photodiode structure having an indented junction interface according to some additional embodiments. The CMOS image sensor 100b comprises a pixel array having sensing pixels arranged in rows and columns according to some embodiments. For example, a first sensing pixel 114 and a second sensing pixel 116 are arranged one next to another in a first row, and a third sensing pixel 122 and a fourth sensing pixel 124 arranged in a second row under the first row. The first sensing pixel 114 and the third sensing pixel 122 are aligned along a first column that is perpendicular to the rows, and the second sensing pixel 116 and the fourth sensing pixel 124 are aligned along a second column that is next to the first column. Notably, though a 2×2 image sensing pixel array is shown in FIG. 1B, the pixel array is extendable to any suitable size for various applications.

The term "pixel" refers to a unit cell containing features (for example, a photodetector and various circuitries, which may include various semiconductor devices) for converting electromagnetic radiation to an electrical signal. The pixels may include photodiodes, complementary metal-oxide-semiconductor (CMOS) image sensors, charged coupling device (CCD) sensors, active sensors, passive sensors, other sensors, or future-developed image sensing devices. The pixels may be designed having various sensor types. For example, one group of pixels may be CMOS image sensors and another group of pixels may be passive sensors. Moreover, the pixels may include color image sensors and/or monochromatic image sensors. In an example, each pixel is an active pixel sensor, such as a complementary metal-oxide-semiconductor (CMOS) image sensor. In the depicted embodiment, each pixel may include a photodetector, such as a photogate-type photodetector, for recording an intensity or brightness of light (radiation). Each pixel may also include various semiconductor devices, such as various transistors including a transfer transistor, a reset transistor, a source-follower transistor, a select transistor, another suitable transistor, or combinations thereof. Additional circuitry, input, and/or output may be coupled to the pixel array to provide an operating environment for the pixels and support external communications with the pixels. For example, the pixel array may be coupled with readout circuitry and/or control circuitry.

Figure 4:
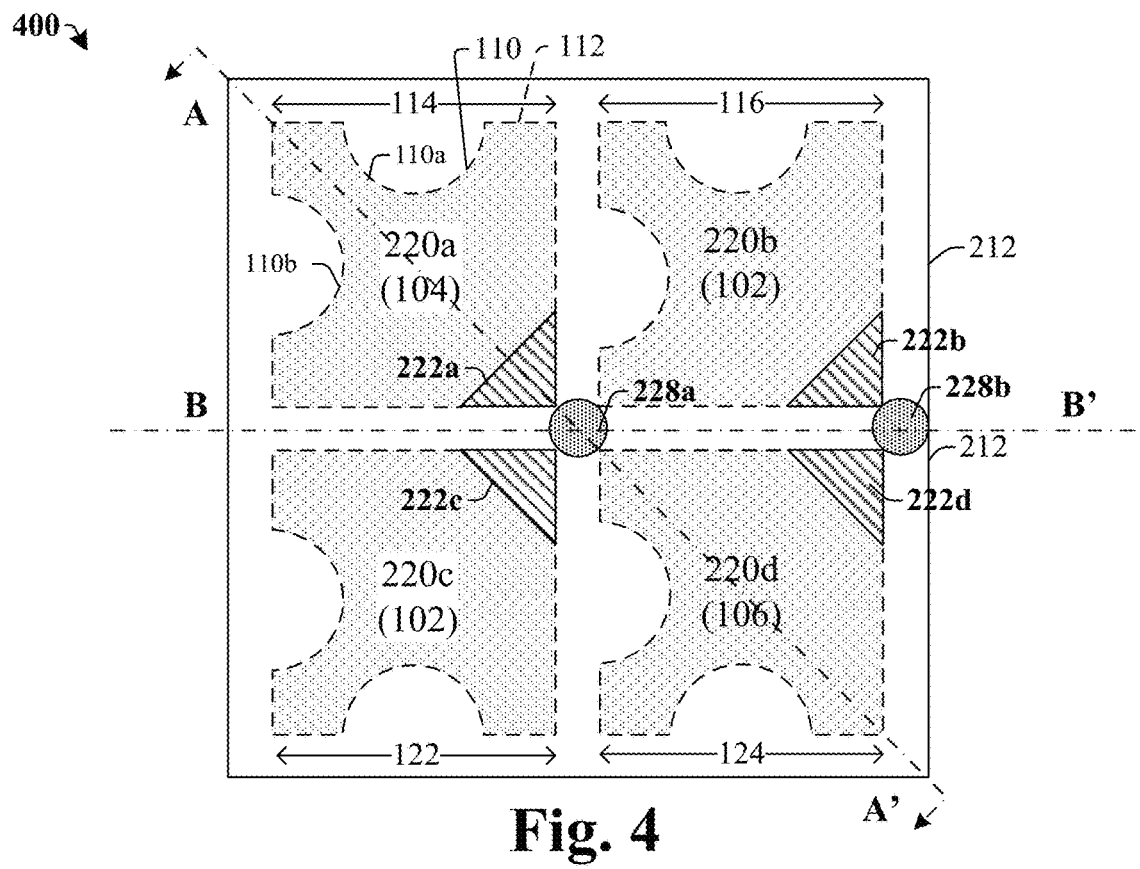
FIG. 4 illustrates a top view of a CMOS image sensor including a photodiode structure having an indented junction interface in accordance with one or more embodiments.
Figure 5A:
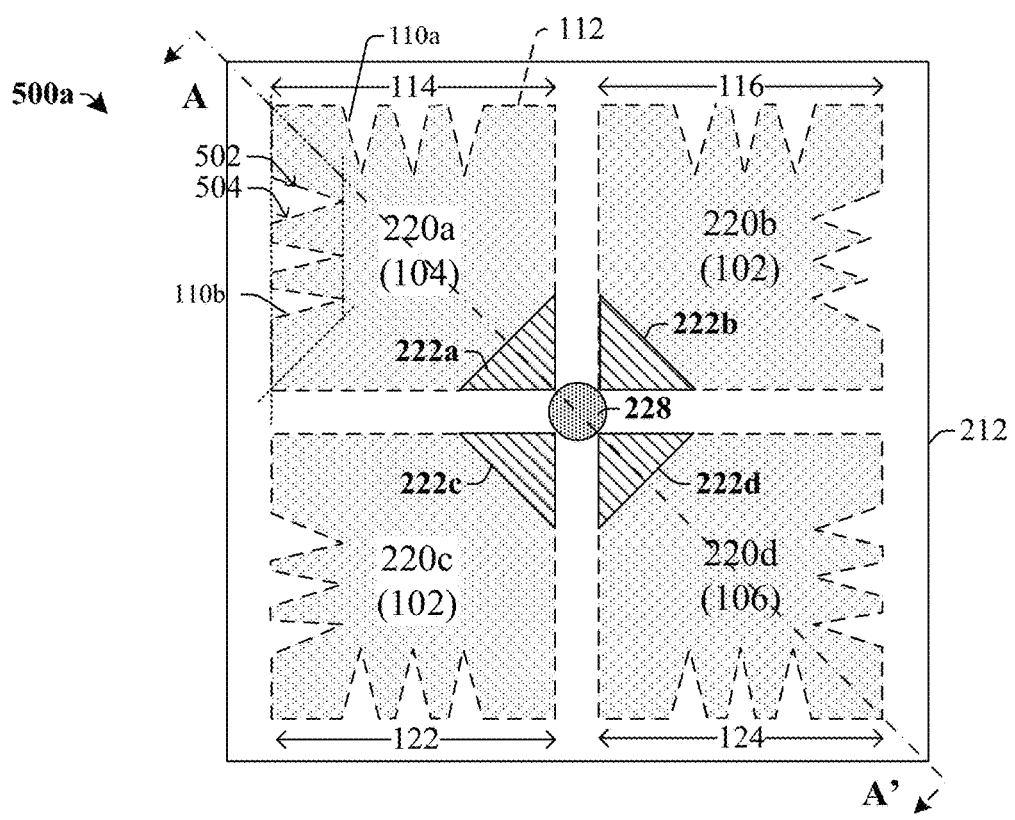
FIG. 5A, FIG. 5B, and FIG. 5C illustrate top views of a CMOS image sensor including a photodiode structure having an indented junction interface in accordance with one or more embodiments.

In some embodiments, the image sensing pixel array is disposed within a substrate 212. A floating diffusion region 228 is disposed within the substrate 212 aside of the sensing pixels 114, 116, 122, or 124. In some embodiments, the floating diffusion region 228 is disposed at a center region of the sensing pixels 114, 116, 122, or 124 and shared by the sensing pixels 114, 116, 122, or 124. Each of the sensing pixels 114, 116, 122, or 124 respectively comprises a transfer gate 222a, 222b, 222c or 222d disposed over the substrate 212. In some embodiments, the transfer gate 222a, 222b, 222c or 222d has a triangular shape. Each of the sensing pixels 114, 116, 122, or 124 further respectively comprises a photo detecting column 220a, 220b, 220c or 220d. For illustration simplicity, features of the CMOS image sensor 100b may be described below using an example pixel such as the fourth sensing pixel 124 and its corresponding components such as the transfer gate 222d and the photo detecting column 220d, but these features can be suitable for other pixels of the CMOS image sensor 100b. The photo detecting column 220d and the substrate 212 are in contact with each other at a junction interface 112. The junction interface 112 may comprise a first recessed portion 110a and a second recessed portion 110b that are symmetrically distributed along an extended line A-A' of centers of the transfer gate 222d and the floating diffusion region 228. As an example, the first recessed portion 110a locates at a center region of one side of the photo detecting column 220d and the second recessed portion 110b locates at a center region of another neighboring side of the photo detecting column 220d. The first recessed portion 110a and the second recessed portion 110b are spaced apart from one another. The first recessed portion 110a and the second recessed portion 110b may comprise various curved or planar surfaces. For example, the recessed portions 110a, 110b can be a "finger" shape as shown in FIG. 1B, i.e., a pair of planar surfaces connected by a curved surface. Also, the recessed portions 110a, 110b can be a single continuous curved surface. A top view of the recessed portions 110a, 110b can be semi-circles as shown in FIG. 4. As another example, the recessed portions 110a, 110b can comprise connected planar surfaces, and a top view can be a plurality of triangles as shown in FIG. 5A. Other forms of the recessed portions 110a, 110b can also be used, and a top view of the recessed portions 110a, 110b can also be rectangle, ellipse, and etc. . . . . In some embodiments, a top view or a top surface 120s of the photo detecting column 220d is a concave polygon shape. The first recessed portion 110a and the second recessed portion 110b may be spaced apart from one another.

Also shown in FIG. 1B, the floating diffusion region 228 is shared by the sensing pixels 114, 116, 122, or 124; therefore, the sensing pixels 114, 116, 122, or 124 have some symmetric features. For example, a first photo detecting column 220a and a first transfer gate 222a of the first sensing pixel 114 and a third photo detecting column 220c and a third transfer gate 222c of the third sensing pixel 122 are symmetric along a separation line B-B' separating the first sensing pixel 114 and the third sensing pixel 122. A second photo detecting column 220b and a second transfer gate 222b of the second sensing pixel 116 and a fourth photo detecting column 220d and a fourth transfer gate 222d of the fourth sensing pixel 124 are symmetric along the separation line B-B' separating the second sensing pixel 116 and the fourth sensing pixel 124. Also, the first photo detecting column 220a and the first transfer gate 222a of the first sensing pixel 114 and the second photo detecting column 220b and a second transfer gate 222b of the second sensing pixel 116 are symmetric along a separation line C-C' separating the first sensing pixel 114 and the second sensing pixel 116. The third photo detecting column 220c and the third transfer gate 222c of the third sensing pixel 122 and a fourth photo detecting column 220d and a fourth transfer gate 222d of the fourth sensing pixel 124 and are symmetric along the separation line C-C' separating the third sensing pixel 122 and the fourth sensing pixel 124.

Figure 2A:
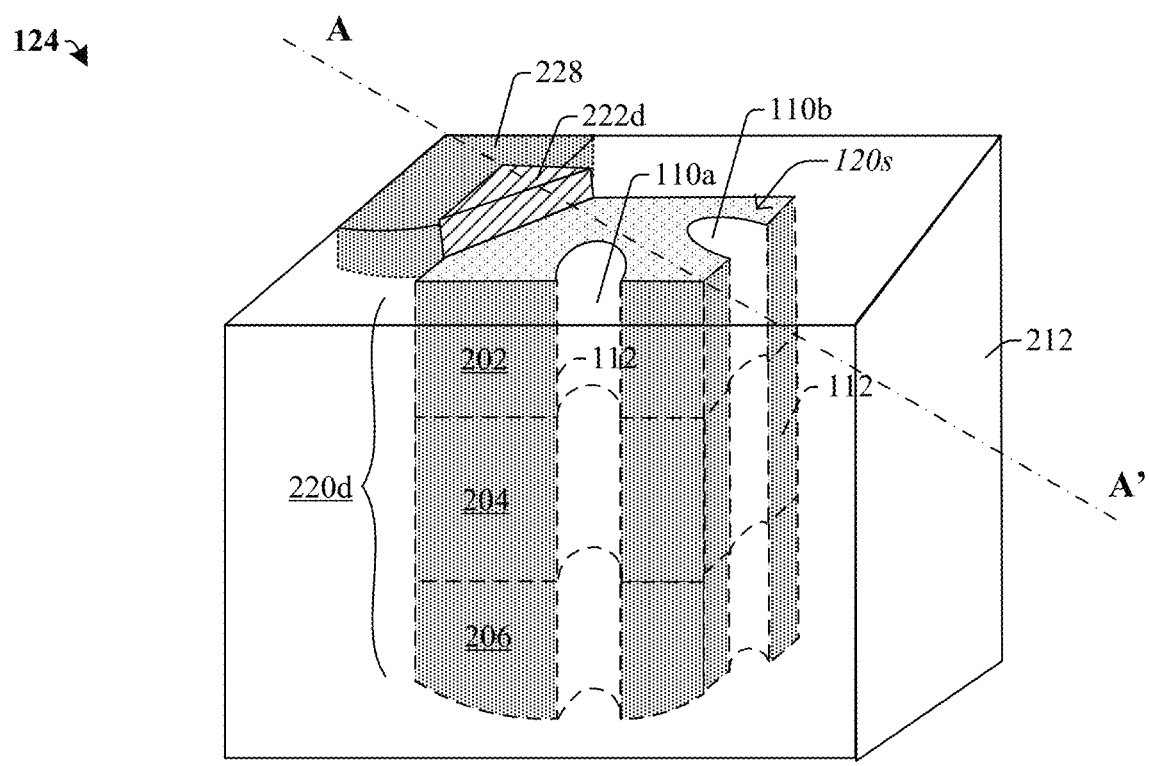
FIG. 2A and FIG. 2B illustrate perspective views of a sensing pixel of the CMOS image sensor in accordance with one or more embodiments.
Figure 2B:
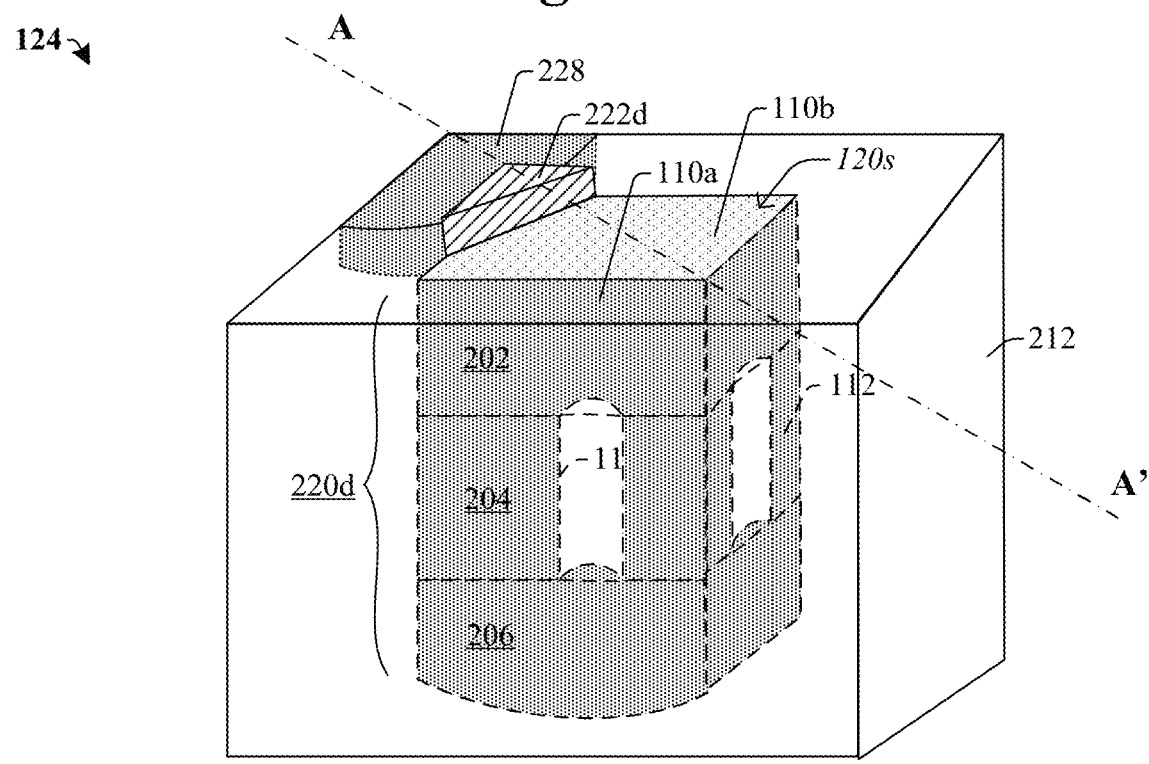

FIG. 2A and FIG. 2B illustrate perspective views of a sensing pixel of the CMOS image sensor 100b of FIG. 1B according to some embodiments. The sensing pixel is shown as the fourth sensing pixel 124 of the pixel array as an example, but it can be any of the sensing pixels of the pixel array. The substrate 212 may have a first doping type, and the photo detecting column 220d may at least comprise a doped sensing layer 204 with a second doping type opposite to the first doping type. The first doping type is one of the n-type and p-type, and the second doping type is the other one of the n-type and p-type. In some embodiments, the photo detecting column 220d further comprises a pinning layer 202 with the first doping type disposed on the doped sensing layer 204, and/or a deep doped layer 206 with the second doping type disposed directly under the doped sensing layer 204. As shown in FIG. 2A, the pinning layer 202, the doped sensing layer 204, and/or the deep doped layer 206 may have sidewall surfaces vertically aligned. As shown in FIG. 2B, in some alternative embodiments, the doped sensing layer 204 has recessed portions 110a and 110b. The deep doped layer 206 may have a portion of sidewall surfaces vertically aligned with non-recessed portions of the doped sensing layer 204, and another portion of the sidewall surfaces vertically not aligned with the recessed portions of the doped sensing layer 204. The pinning layer 202 is heavily doped (having a doping concentration in a range of $10^{18}$ to $10^{20}$ cm$^{-3}$ for example) and disposed under a surface of the substrate 212. The pinning layer 202 helps to reduce the dark current (by isolating the collection buried channel from the charges generated at the $SiO_2$—Si interface), but also limits the maximum channel potential, often referred to as pinning voltage. The pinning layer 202 has a doping concentration greater than that of the doped sensing layer 204. The deep doped layer 206 has a doping concentration smaller than that of the doped sensing layer 204.

The photo detecting column 220d and the substrate 212 are in contact with each other at the junction interface 112. The photo detecting column 220d and the substrate 212 are configured as a photodiode structure to convert radiation that enters the substrate 212 into an electrical signal. The photo detecting column 220d detects intensity (brightness) of radiation, such as incident radiation (light), directed toward the substrate 212. The incident radiation is visual light. Alternatively, the radiation is infrared (IR), ultraviolet (UV), x-ray, microwave, another suitable radiation type, or combinations thereof. The recessed portions 110a, 110b enlarge the area of the junction interface 112 and thereby increasing the full well capacity of the CMOS image sensor 100b.

Figure 3A:
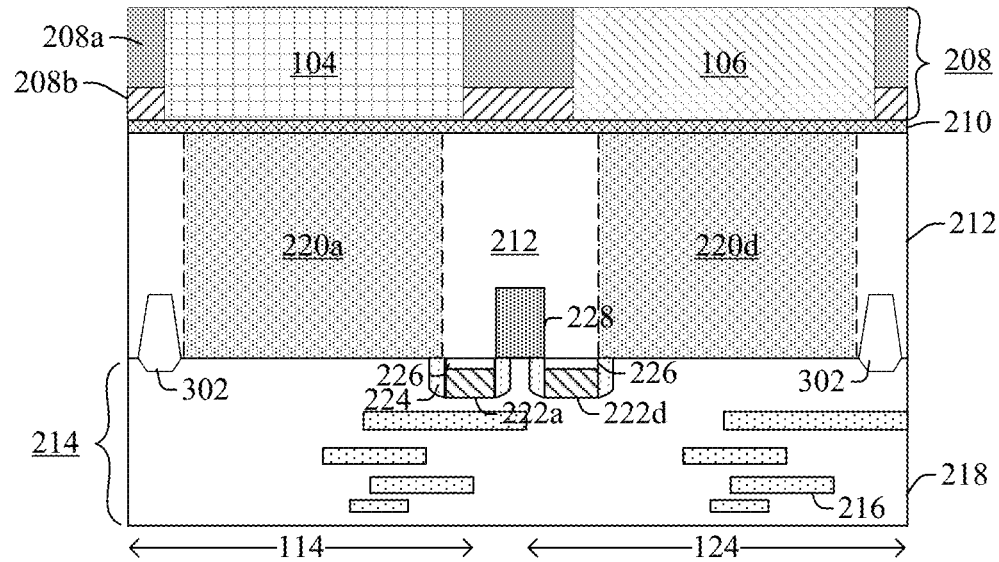
FIG. 3A and FIG. 3B illustrate cross-sectional views of the CMOS image sensor of FIG. 1B along line A-A' in accordance with one or more embodiments.

FIG. 3A illustrates a cross-sectional view 300a of the CMOS image sensor 100b of FIG. 1B (along line A-A') according to some embodiments. The transfer gate 222a of the first sensing pixel 114 and the transfer gate 222d of the fourth sensing pixel 124 are arranged over the substrate 212 and separated from the substrate 212 by a gate dielectric layer 226. The gate dielectric layer 226 includes a dielectric material, such as silicon oxide, a high-k dielectric material, other dielectric material, or combinations thereof. Examples of the high-k dielectric material include HfO2, HfSiO, HfSiON, HfTaO, HfTiO, HfZrO, Zirconium oxide, Aluminum oxide, Hafnium dioxide-alumina (HfO2-Al2O3) alloy, other high-k dielectric material, or combinations thereof. The transfer gate 222a, 222d includes polysilicon and/or a metal including Al, Cu, Ti, Ta, W, Mo, TaN, NiSi, CoSi, TiN, WN, TiAl, TiAlN, TaCN, TaC, TaSiN, other conductive material, or combinations thereof. The transfer gate 222a, 222d may comprise sidewall spacer 224 disposed on the sidewalls of the gate stacks. According to one or more embodiments, the sidewall spacer 224 may be a silicon nitride, silicon oxynitride, other suitable material, or combinations thereof in a multi-layer structure.

The photo detecting columns 220a, 220d are arranged within the substrate 212. The sensing pixels 114, 124 share a floating diffusion region 228 arranged between the transfer gates 222a, 222d and within the substrate 212. The transfer gate 222a, 222d interposes the floating diffusion region 228 and the photo detecting columns 220a, 220d, such that a channel associated with a transfer transistor is defined between the floating diffusion region 228 and the photo detecting columns 220a, 220d. The CMOS image sensor 100b may further comprise other transistors, such as a reset transistor, a source-follower transistor, and a select transistor (not illustrated), other suitable transistors, or combinations thereof. The photo detecting columns 220a, 220d and various transistors (which can collectively be referred to as pixel circuitry) allow the sensing pixels 114, 124 to detect the intensity of the particular light wavelength. Additional circuitry, input, and/or outputs may be provided to the sensing pixels 114, 124 to provide an operating environment for the sensing pixels 114, 124 and/or support communication with the sensing pixels 114, 124. The deep doped layer 206 has a thickness about two times greater than that of the doped sensing later 204.

A color filter array is disposed over the substrate 212, comprising color filters 104, 106 corresponding to sensing pixels 114, 124. In some embodiment, color filters 102, 104, 106 (shown in FIG. 1B) filter different spectrums of radiation. For example, for an RGB image sensor, a first color filter 102 can be configured to transmit blue light while blocking other colors; a second color filter 104 can be configured to transmit red light, and a third color filter 106 can be configured to transmit green light. The color filters 104, 106 are disposed over the substrate 212 overlying the corresponding photo detecting columns 220a, 220d. A composite grid 208 is disposed between color filters of the color filter array (e.g. the color filters 104, 106) for isolation purpose. In some embodiments, the composite grid 208 comprises a metal grid structure 208b disposed within a dielectric light guide structure 208a. In some embodiments, the dielectric light guide structure 208a may comprise one or more dielectric structures, for example, a silicon nitride grid, silicon oxynitride grid, or a silicon dioxide grid. In some embodiments, an antireflective layer 210 can be disposed between the color filter array and the photodiode array, configured to improve transmission of the incident radiance.

Figure 3B:
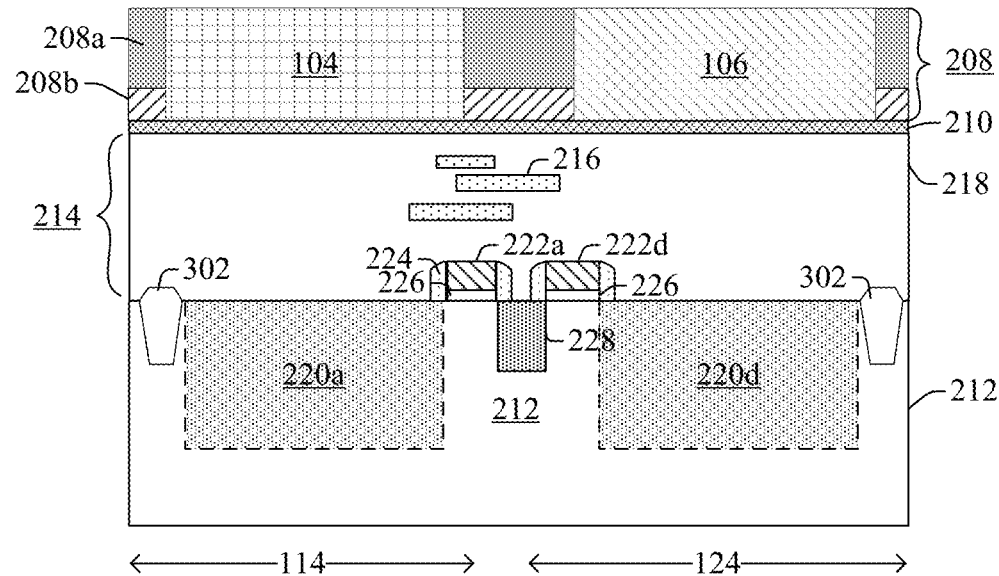

In some embodiments, an interconnect structure 214 is arranged under the substrate 212 opposite the color filter array. The interconnect structure 214 comprises a plurality of metal lines 216 (e.g., copper wires and/or vias) arranged within one or more dielectric layers 218. In some embodiments, the transfer gates 222a, 222d and some processing devices such as the source follower transistors or the reset switch transistors may be arranged within the substrate 212 and the dielectric layers 218. It is appreciated that although a back illumination structure (BIS) is shown in FIG. 3A, a front-illumination structure (FIS) is also amenable. An example of a FIS CMOS image sensor is shown by a cross-sectional view 300b of FIG. 3B according to some embodiments.

FIG. 4 illustrates a top view of a CMOS image sensor 400 including a photodiode structure having an indented junction interface according to some additional embodiments. Some features of the CMOS image sensor 400 is same or similar to what is described associated with other figures of the invention and is not repeated here for simplicity. These features may use same or different numerals with remaining figures herein. A first floating diffusion region 228a and a second floating diffusion region 228b disposed within the substrate 212 aside of the sensing pixels 114, 116, 122, or 124 are shown in FIG. 4. In some embodiments, the first floating diffusion region 228a is disposed between and shared by the first sensing pixel 114 and the third sensing pixel 122; and the second floating diffusion region 228b is disposed between and shared by the second sensing pixel 116, and the fourth sensing pixel 124. Compared to FIG. 1B, the symmetrical feature of the first sensing pixel 114 and the third sensing pixel 122 and the symmetrical feature of the second sensing pixel 116 and the fourth sensing pixel 124 along the separation line B-B' also apply to FIG. 4. However, the symmetrical feature of the first sensing pixel 114 and the second sensing pixel 116, and the third sensing pixel 122 and the fourth sensing pixel 124 along the separation line C-C' separating do not apply to FIG. 4.

Figure 5B:
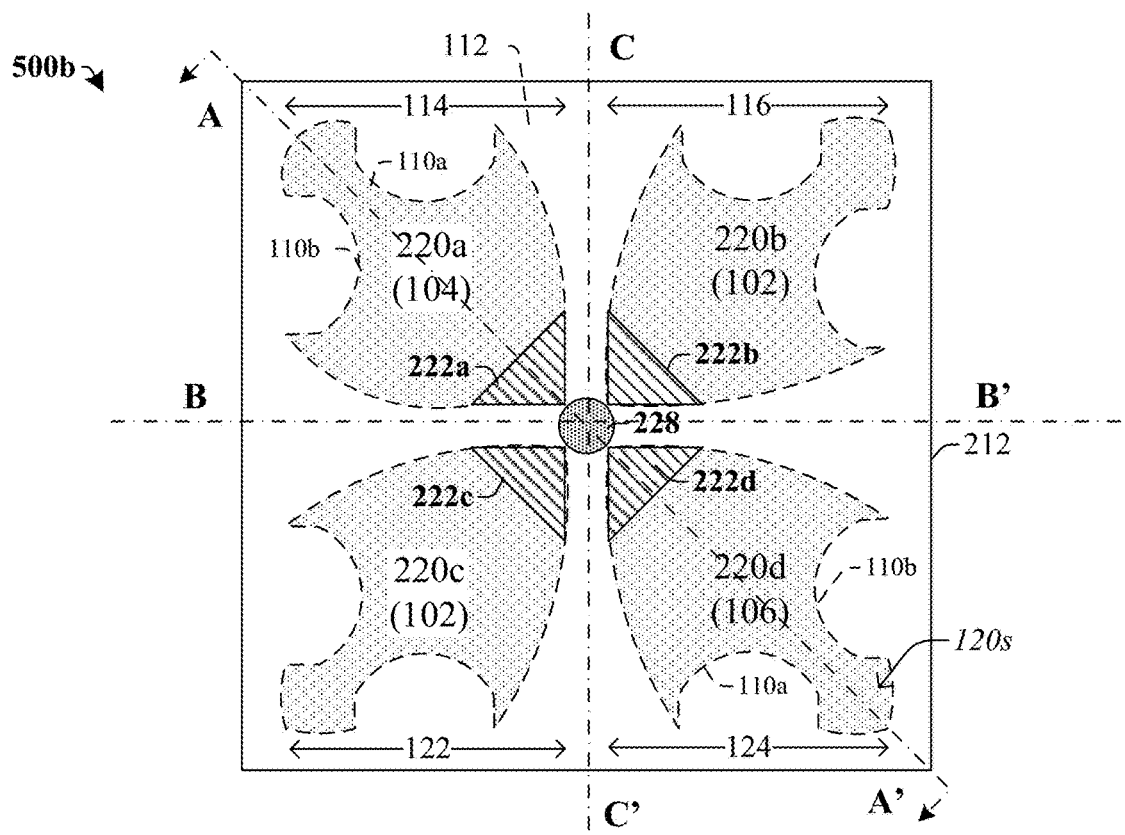
Figure 5C:
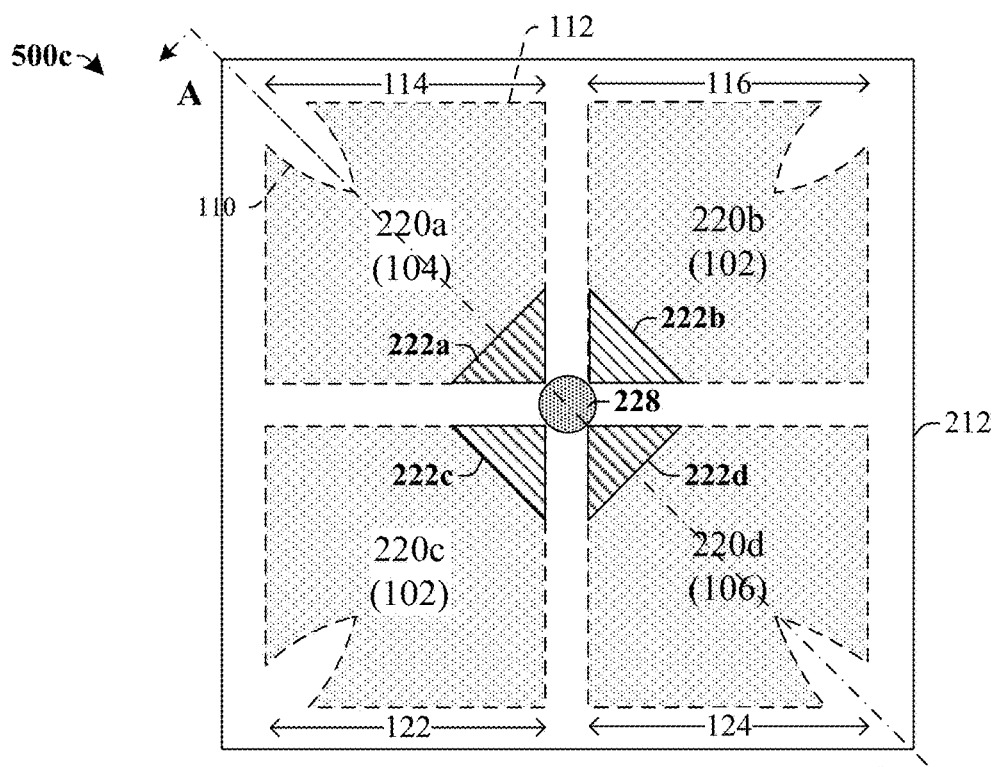

FIG. 5A illustrates a top view of a CMOS image sensor 500a including a photodiode structure having an indented junction interface according to some additional embodiments. The recessed portions 110a, 110b of the photo detecting columns 220a-220d can comprise connected planar surfaces 502, 504. A top view can be a plurality of triangles as shown in FIG. 5A. The photo detecting columns 220a-220d can be other shapes, such as circle, triangle, ellipse, or finger shape with recesses. FIG. 5B shows an example of the photo detecting columns 220a-220d having a finger shape according to some additional embodiments. The recessed portions 110a, 110b of the photo detecting columns 220a-220d can be arranged at other locations of the photo detecting columns 220a-220d. FIG. 5C shows an example of the photo detecting columns 220a-220d each having a recessed portion 110 arranged at an extended line A-A' connecting the corresponding transfer gate 222a-222d and the floating diffusion region 228 according to some additional embodiments.

FIGS. 6-11 illustrate some embodiments of cross-sectional or top views (along line A-A' of FIG. 1B for example) showing a method of forming a CMOS image sensor including a photodiode structure having an indented junction interface.

Figure 6:
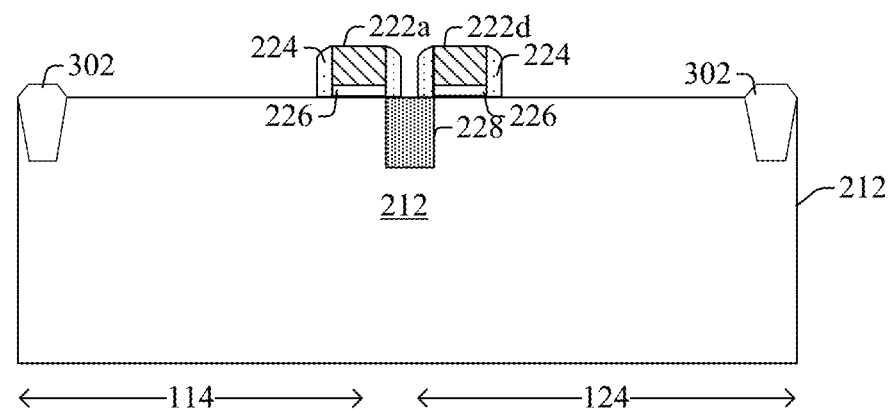
FIGS. 6-11 illustrate cross-sectional or top views showing a method of forming a CMOS image sensor including a photodiode structure having an indented junction interface in accordance with one or more embodiments.

As shown in cross-sectional view 600 of FIG. 6, a first transfer gate 222a and a fourth transfer gate 222d are formed over a substrate 212 and separated from the substrate 212 by a gate dielectric 226. The transfer gates 222a, 222d, and the gate dielectric 226 may be formed by depositing a gate dielectric film and a gate electrode film over the substrate 212 followed by a patterning process. A sidewall spacer 224 may be formed on the outer sidewalls of the transfer gates 222a, 222d and the gate dielectric 226. In some embodiments, the sidewall spacer 224 may be formed by depositing a conformal nitride layer onto the substrate 212 and selectively etching the conformal nitride layer to remove a lateral portion and to leave a vertical portion along sidewalls of the transfer gates 222a, 222d and the gate dielectric 226.

One or more isolation structures may be formed prior to or after formation of the transfer gates 222a, 222d to separate (or isolate) various regions and/or devices formed on or within the substrate 212, such as local oxidation of silicon (LOCOS) and/or shallow trench isolation (STI). For example, an isolation feature 302 may be formed within the front-side of the substrate 212 by selectively etching the substrate 212 to form shallow-trenches and subsequently forming a dielectric (e.g. an oxide) within the shallow-trenches. The isolation feature 302 isolates adjacent sensing pixels 114, 124.

A floating diffusion region 228 is formed between the first transfer gate 222a and the fourth transfer gate 222d. The floating diffusion region 228 may be formed by an implantation process. In some embodiments, the substrate 212 may be selectively implanted according to a patterned masking layer (not shown) comprising photoresist or according to other features formed on the substrate 212, such as the isolation feature 302 and/or transfer gates 222a, 222d. In various embodiments, the substrate 212 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. The substrate 212 may be prepared including a first region of the photodiode to be formed with a first doping type (e.g. p-type such as boron). A blanket implant or a grading epitaxial growth process may be performed to form the first region of the photodiode to be formed with the first doping type. A dopant species is then implanted into the substrate 212 to form the floating diffusion region 228. In some embodiments, the dopant species may comprise a second doping type (e.g. an n-type dopant such as phosphorous) that is implanted into the substrate 212. In other embodiments, the dopant species may comprise the first doping type.

Figure 7:
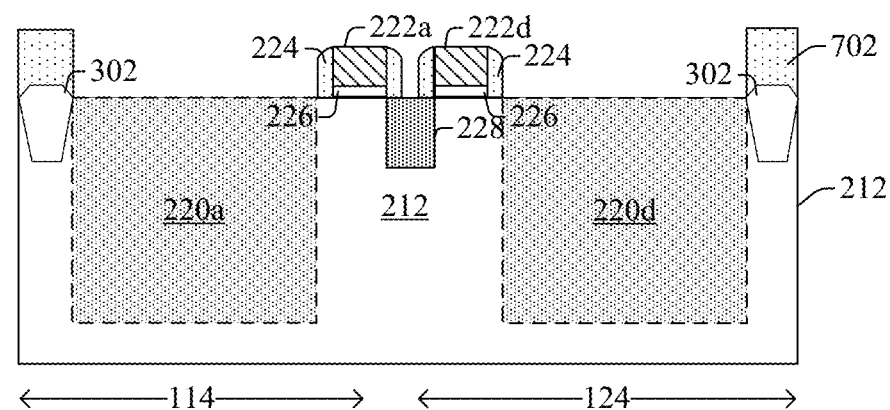
Figure 8:
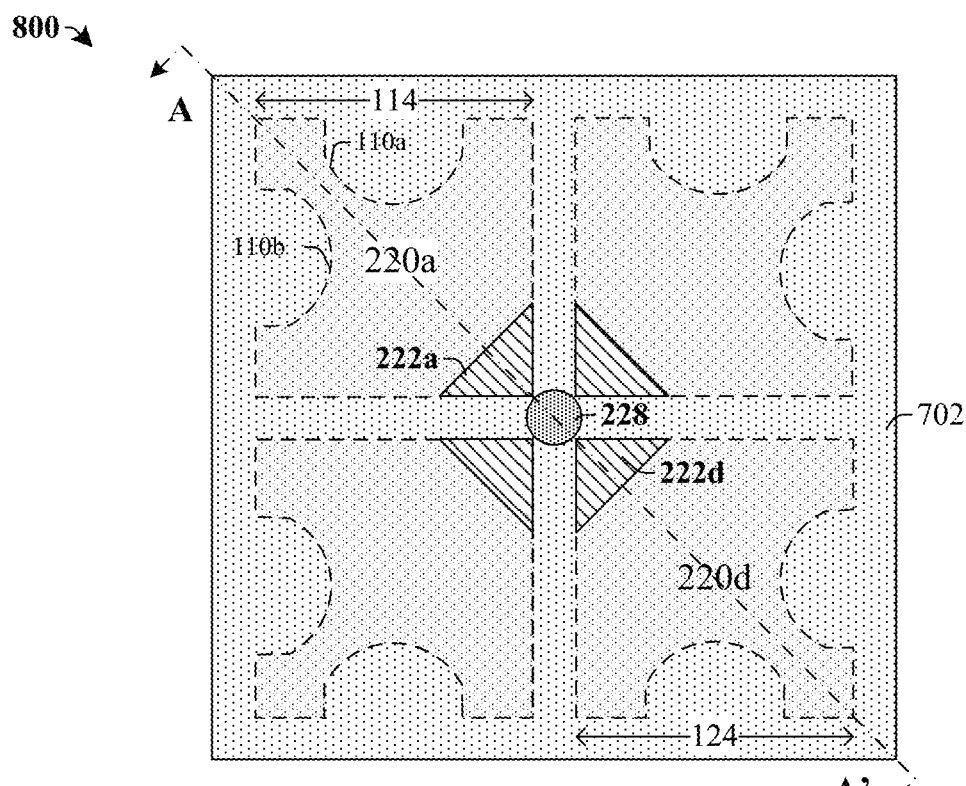

As shown in cross-sectional view 700 of FIG. 7, dopant species are implanted into a substrate 212 to form a doped region including a photo detecting column 220a, 220d. The photo detecting column 220 is formed to be recessed inwardly relative to the face/line, such as shown in FIGS. 1A-5C. In some embodiments, the photo detecting column 220a, 220d may be formed by selectively implanting the substrate 212 according to a patterned masking layer 702. A top view of the patterned masking layer 702 and the formed photo detecting column 220a, 220d are shown in FIG. 8 along with the transfer gates 222a, 222d, and the floating diffusion region 228. The patterned masking layer 702 can be formed to have an opening corresponding to the photo detecting column 220a, 220d. The patterned masking layer 702 is subsequently removed.

In some embodiments, the dopant species may be implanted as a blanket implantation (i.e., an unmasked implantation) to form a deep doping well extending into the substrate 212 followed by a selective implantation (i.e., a masked implantation) to form the photo detecting column 220a, 220d having a plurality of columns extending into a depth of the substrate 212 that is shallower than the deep doping well. The deep doping well may have a smaller doping concentration than the plurality of columns. In some embodiments, a deep doped layer (206 in FIGS. 2A-2B) with the second doping type is formed deep into the substrate 212. A doped sensing layer (204 in FIG. 2 FIGS. 2A-2B) with the second doping type is formed directly on the deep doped layer. A pinning layer (202 in FIGS. 2A-2B) with the first doping type is formed directly on the doped sensing layer. The deep doped layer, the doped sensing layer, and the pinning layer may have sidewall surfaces vertically aligned and recessed inwardly relative to the face/line.

Figure 9:
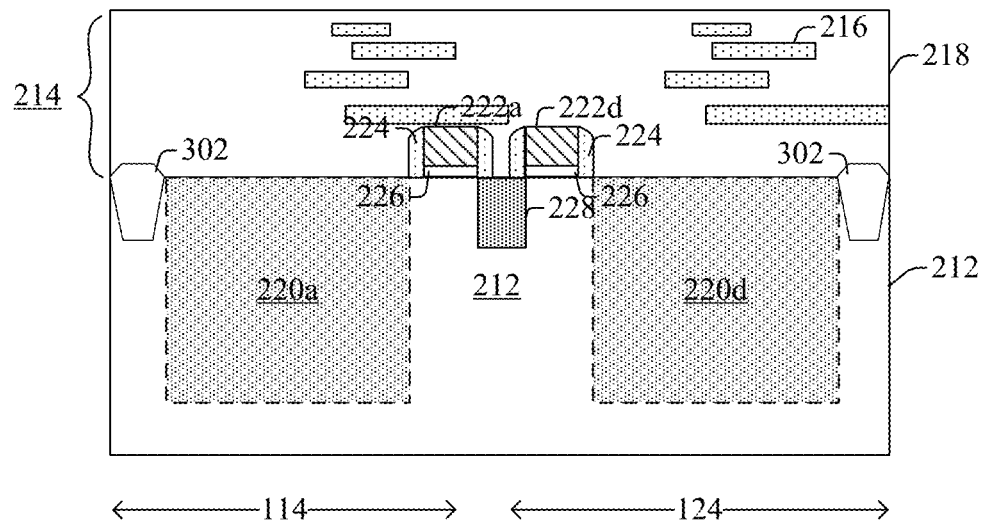

As shown in cross-sectional view 900 of FIG. 9, an interconnect structure 214 is formed over the transfer gates 222a, 222d. The interconnect structure 214 is formed having a plurality of metal lines 216 (e.g., copper wires and/or vias) arranged within one or more dielectric layers 218.

Figure 10:
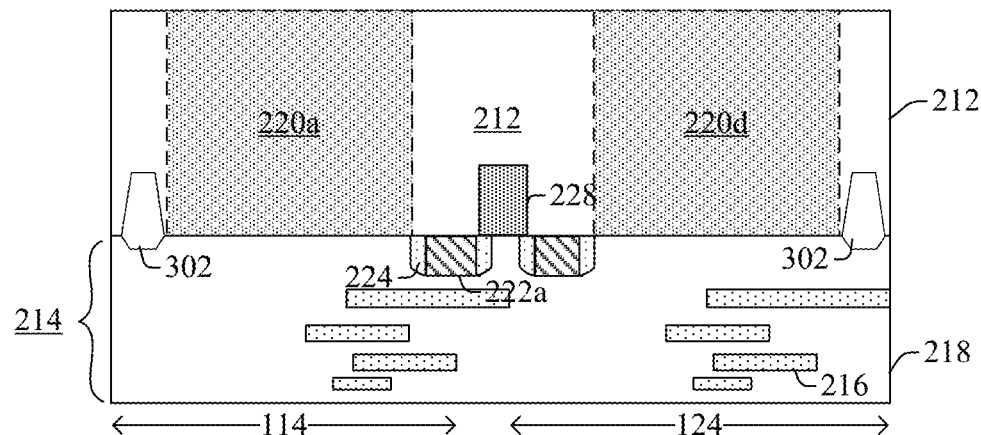

As shown in cross-sectional view 1000 of FIG. 10, the workpiece is flipped over and thinned down from a back-side of the substrate 212 by a thinning process. The substrate 212 may be thinned by a chemical-mechanical polishing process and/or other etching processes. In some embodiments, the photo detecting column 220a, 220d are exposed from the back-side of the substrate 212 after the thinning process.

Figure 11:
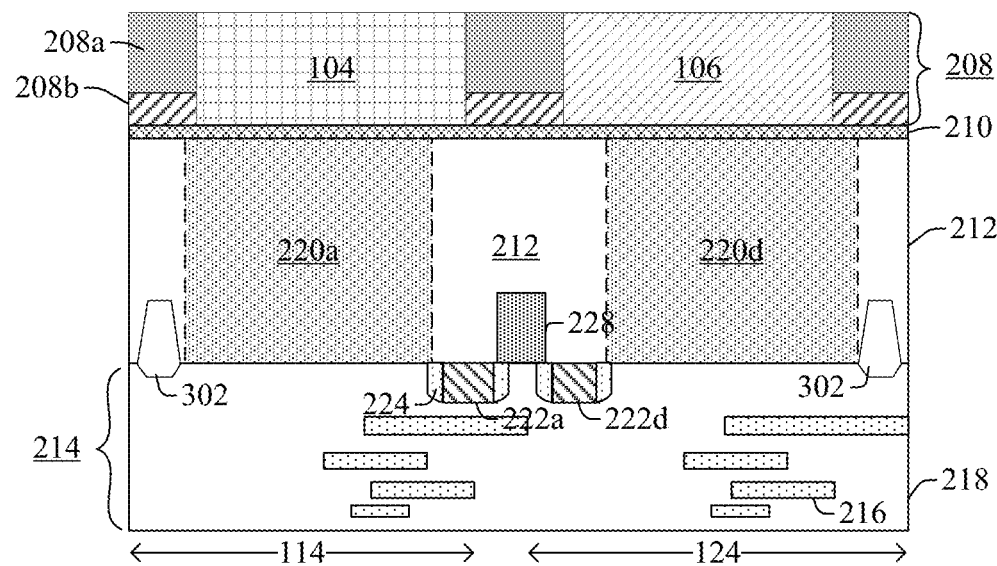

As shown in cross-sectional view 1100 of FIG. 11, color filters (e.g. 104, 106) are formed overlying the corresponding photo detecting column 220a, 220d. In some embodiments, a buffer layer and/or an antireflective layer 210 are formed over the substrate 212. A metal grid structure 208b is disposed over the antireflective layer 210 between the color filters. A dielectric light guide structure 208a is formed over the metal grid structure 208b. In some embodiments, the antireflective layer 210, the metal grid structure 208b, and the dielectric light guide structure 208a can be firstly formed using one or more of deposition processes (e.g., chemical vapor deposition (CVD), physical vapor deposition (PVD),), sputtering, or coating processes. Then a series of etching processes are performed to pattern the dielectric light guide structure 208a and the metal grid structure 208b to form openings for the color filters.

Then color filters 104, 106 are formed within the openings. The color filters 104, 106 are assigned colors, such as red, green, and blue, and configured to transmit the assigned colors while blocking other colors. The process for forming the color filters 104, 106 may include, for each of the color assignments, forming a color filter layer and patterning the color filter layer. The color filter layer may be formed so as to fill the assigned openings and to cover the dielectric light guide structure 208a. The color filter layer may then be planarized and/or etched back to approximately even an upper surface of the dielectric light guide structure 208a. Though not shown in the figures, in some embodiments, a second buffer layer or a glue layer can be formed over the color filters, and micro-lenses can be formed over the second buffer layer. The second buffer layer may be formed by, for example, one or more of vapor deposition, atomic layer deposition (ALD), spin coating, and the like. The micro-lens may be, for example, formed of the same material as the second buffer layer and/or formed using, for example, one or more of vapor deposition, ALD, spin coating, and the like. After forming a micro-lens layer, the micro-lens layer is patterned to define footprints of corresponding micro-lenses. For example, a photoresist layer masking select regions of the micro-lens layer may be formed over the micro-lens layer, used as a mask during an etch of the micro-lens layer, and subsequently removed. With the micro-lens layer patterned, one or more reflow and/or heating processes can be performed on the patterned micro-lens layer to round corners of the patterned micro-lens layer.

Figure 12:
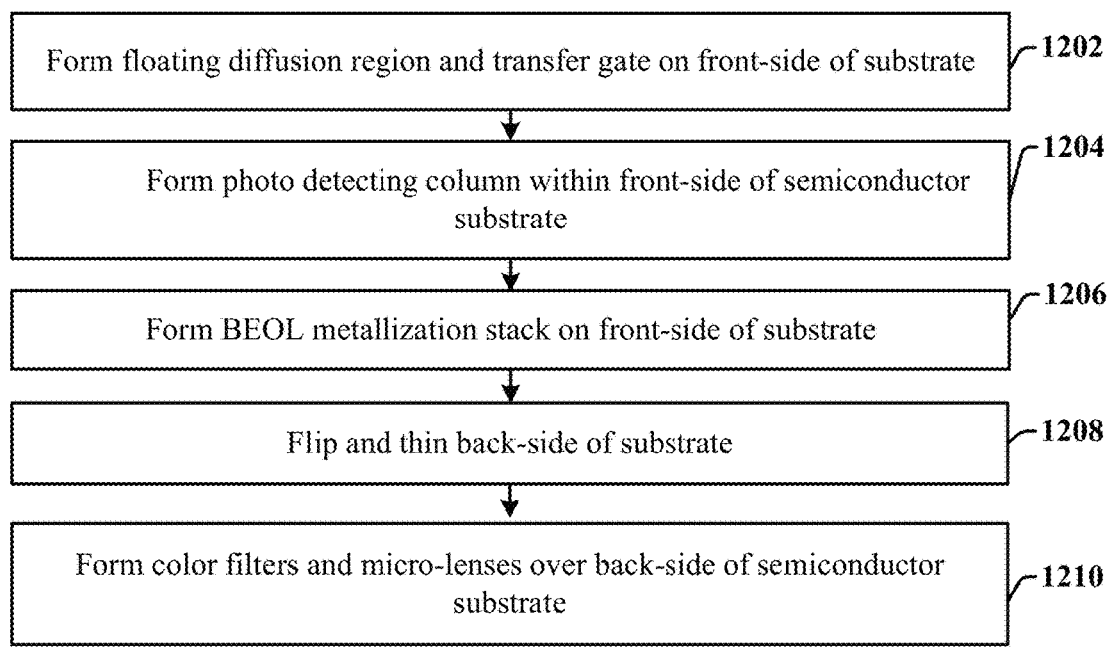
FIG. 12 illustrates a flow diagram of a method of forming a CMOS image sensor including a photodiode structure having an indented junction interface in accordance with one or more embodiments.

FIG. 12 illustrates a flow diagram of some embodiments of a method 1200 of forming a CMOS image sensor including a photodiode structure having an indented junction interface.

While disclosed method 1200 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases At act 1202, a floating diffusion region and a transfer gate are formed within a front-side of the substrate. FIG. 6 illustrates a cross-sectional view corresponding to some embodiments corresponding to act 1202.

At act 1204, a photo detecting column is formed within the front-side of the substrate. In some embodiments, at least some part of the photo detecting column may be formed by implanting dopant species into the front-side of the substrate. The photo detecting column may be implanted as a blanket implantation followed by a selective implantation to form a plurality of columns extending into the substrate. FIG. 7 illustrates a cross-sectional view corresponding to some embodiments corresponding to act 1204.

At act 1206, a BEOL metallization stack is formed over the transfer gate on the front-side of the substrate. FIG. 9 illustrates a cross-sectional view corresponding to some embodiments corresponding to act 1206.

At act 1208, the substrate is flipped over for further processing. A back-side of the substrate is thinned and the photo detecting column may be exposed. FIG. 10 illustrates a cross-sectional view corresponding to some embodiments corresponding to act 1208.

At act 1210, color filters are formed over the back-side of the semiconductor substrate. FIG. 11 illustrates a cross-sectional view corresponding to some embodiments corresponding to act 1210.

Therefore, the present disclosure relates to a CMOS image sensor including a photodiode structure having an indented junction interface, and an associated method of formation. In some embodiments, the CMOS image sensor comprises a substrate with a first doping type and a transfer gate disposed on a front-side of the substrate and separated from the substrate by a gate dielectric. The CMOS image sensor further comprises a floating diffusion region with a second doping type disposed at one side of the transfer gate within the substrate and a photo detecting column disposed at the other side of the transfer gate opposing to the floating diffusion region within the substrate. The photo detecting column comprises a doped sensing layer with the second doping type. The photo detecting column and the substrate are in contact with each other at a junction interface and configured as a photodiode structure to convert radiation that enters the substrate into an electrical signal. The junction interface comprises one or more recessed portions.

In some alternative embodiments, the present disclosure relates to a CMOS image sensor. The CMOS image sensor comprises a substrate with a first doping type and a pixel array comprising a plurality of pixels. Each of the pixels comprises a transfer gate disposed over the substrate and a photo detecting column with the second doping type disposed within the substrate at one side of the transfer gate opposing to a floating diffusion region with a second doping type. The photo detecting column and the substrate are in contact with each other at a junction interface and configured as a photodiode structure to convert radiation that enters the substrate into an electrical signal. The junction interface comprises recessed portions that are symmetrically distributed along an extended line of centers of the transfer gate and the floating diffusion region.

In yet other embodiments, the present disclosure relates to a method of forming an image sensor. The method comprises preparing a substrate with a first doping type and forming a transfer gate over the substrate. The method further comprises forming a floating diffusion region within the substrate and forming a masking layer over the substrate, the masking layer having a circumference including recessed portions that are symmetrically distributed along an extended line of centers of the transfer gate and the floating diffusion region. The method further comprises performing a plurality of implantation processes to form a photo detecting column within the substrate at one side of the transfer gate opposing to the floating diffusion region with the masking layer in place. The photo detecting column and the substrate are in contact with each other at a junction interface and configured as a photodiode structure to convert radiation that enters the substrate into an electrical signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure and that they may make various changes, substitutions, and alterations herein without departing from the spirit and scope of the present disclosure.

What is claimed is:

1. A CMOS image sensor, comprising:
    a substrate with a first doping type;
    a transfer gate disposed on a front-side of the substrate and separated from the substrate by a gate dielectric;
    a floating diffusion region with a second doping type disposed at one side of the transfer gate within the substrate; and
    a photo detecting column disposed at the other side of the transfer gate opposing to the floating diffusion region within the substrate, the photo detecting column comprising a doped sensing layer with the second doping type, a pinning layer with the first doping type disposed on the doped sensing layer, and a deep doped layer with the second doping type disposed directly under the doped sensing layer;
    wherein the photo detecting column and the substrate are in contact with each other at a junction interface and configured as a photodiode structure to convert radiation that enters the substrate into an electrical signal; and
    wherein the junction interface comprises one or more recessed portions.

2. The CMOS image sensor of claim 1, wherein the junction interface comprises a first recessed portion and a second recessed portion connected by a protruding portion, wherein the first recessed portion and the second recessed portion are symmetrically distributed along an extended line of centers of the transfer gate and the floating diffusion region.

3. The CMOS image sensor of claim 2, wherein the first recessed portion and the second recessed portion are spaced apart from one another by the protruding portion.

4. The CMOS image sensor of claim 1, wherein a top surface of the photo detecting column has a concave polygon shape.

5. The CMOS image sensor of claim 1, wherein the deep doped layer has a doping concentration smaller than that of the doped sensing layer.

6. The CMOS image sensor of claim 5, wherein the deep doped layer has a thickness about two times greater than that of the doped sensing layer.

7. The CMOS image sensor of claim 5, wherein the deep doped layer has a sidewall surface vertically aligned with that of the doped sensing layer.

8. The CMOS image sensor of claim 1, further comprising:
    a shallow trench isolation (STI) structure disposed between adjacent pixel regions from the front-side of the substrate to a position within the substrate and surrounding the photo detecting column.

9. The CMOS image sensor of claim 1, further comprising:
    a back-end-of-the-line (BEOL) metallization stack arranged on the front-side of the substrate and comprising a plurality of metal interconnect layers arranged within one or more inter-level dielectric layers.

10. The CMOS image sensor of claim 1, further comprising:
    a color filter disposed on a back-side of the substrate opposite to the front-side, the color filter being arranged within a grid structure and overlying the photo detecting column.

11. A CMOS image sensor, comprising:
    a substrate with a first doping type; and
    a pixel array comprising a plurality of pixels, each of the pixels comprising a transfer gate disposed on a front-side of the substrate and a photo detecting column with a second doping type disposed within the substrate at one side of the transfer gate opposing to a floating diffusion region with the second doping type, the photo detecting column having a top surface closer to a front-side surface of the substrate and a bottom surface within the substrate;
    wherein the photo detecting column and the substrate are in contact with each other at a junction interface and configured as a photodiode structure to convert radiation that enters the substrate into an electrical signal; and
    wherein the junction interface comprises recessed portions that extend from the top surface to the bottom surface of the photo detecting column.

12. The CMOS image sensor of claim 11,
    wherein the pixel array comprises four pixels arranged in rows and columns as a 2×2 array including a first sensing pixel and a second sensing pixel arranged in a first row and a third sensing pixel and a fourth sensing pixel arranged in a second row;
    wherein a first photo detecting column and a first transfer gate of the first sensing pixel and a third photo detecting column and a third transfer gate of the third sensing pixel are symmetric along a separation line separating the first sensing pixel and the third sensing pixel; and
    wherein a second photo detecting column and a second transfer gate of the second sensing pixel and a fourth photo detecting column and a fourth transfer gate of the fourth sensing pixel are symmetric along a separation line separating the second sensing pixel and the fourth sensing pixel.

13. The CMOS image sensor of claim 12, wherein the first, second, third and fourth sensing pixels share a same floating diffusion region.

14. The CMOS image sensor of claim 13,
wherein the first photo detecting column and the first transfer gate of the first sensing pixel and the second photo detecting column and the second transfer gate of the second sensing pixel are symmetric along a separation line separating the first sensing pixel and the second sensing pixel;
wherein the third photo detecting column and the third transfer gate of the third sensing pixel and the fourth photo detecting column and the fourth transfer gate of the fourth sensing pixel and are symmetric along a separation line separating the third sensing pixel and the fourth sensing pixel.

15. The CMOS image sensor of claim 12, wherein the first sensing pixel and the third sensing pixel share a first floating diffusion region, and the second sensing pixel and the fourth sensing pixel share a second floating diffusion region.

16. The CMOS image sensor of claim 11, wherein the transfer gate has a triangular shape.

17. The CMOS image sensor of claim 11, wherein a top surface of the photo detecting column has a concave polygon shape.

18. The CMOS image sensor of claim 11, further comprising:
a back-end-of-the-line (BEOL) metallization stack arranged on the front-side of the substrate and comprising a plurality of metal interconnect layers arranged within one or more inter-level dielectric layers; and
a color filter disposed on a back-side of the substrate opposite to the front-side, the color filter being arranged within a grid structure and overlying the photo detecting column.

19. An image sensor, comprising:
a substrate with a first doping type;
a transfer gate disposed over the substrate;
a floating diffusion region disposed within the substrate; and
a photo detecting column disposed within the substrate at one side of the transfer gate opposing to the floating diffusion region, the photo detecting column having a top surface coplanar with an upper surface of the substrate, wherein the top surface comprises recessed portions that are symmetrically distributed along an extended line of centers of the transfer gate and the floating diffusion region;
wherein the photo detecting column and the substrate are in contact with each other at a junction interface and configured as a photodiode structure to convert radiation that enters the substrate into an electrical signal.

20. The image sensor of claim 19, further comprising:
a back-end-of-the-line (BEOL) metallization stack on a front-side of the substrate, wherein the BEOL metallization stack comprises a plurality of metal interconnect layers arranged within one or more inter-level dielectric layers.

* * * * *